United States Patent [19]

Tokito et al.

[11] Patent Number: 5,783,292
[45] Date of Patent: Jul. 21, 1998

[54] ELECTROLUMINESCENT DEVICE WITH ORGANIC-INORGANIC COMPOSITE THIN FILM

[75] Inventors: Shizuo Tokito; Yasunori Taga, both of Nagoya, Japan

[73] Assignee: Kabushiki Kaisha Toyota Chuo Kenkyusho, Aichi-ken, Japan

[21] Appl. No.: 535,338

[22] Filed: Sep. 28, 1995

[30] Foreign Application Priority Data

Sep. 29, 1994 [JP] Japan ................... 6-261285

[51] Int. Cl.$^6$ ................... H05B 33/12; B32B 7/00
[52] U.S. Cl. ................... 428/212; 428/690; 428/917; 428/457; 428/215; 428/323; 428/332; 428/696; 428/698; 428/702; 428/704; 313/502; 313/504; 313/506; 257/40; 257/13; 257/15; 257/28
[58] Field of Search ................... 428/212, 215, 428/220, 323, 332, 457, 689, 690, 691, 696, 698, 702, 704, 917; 313/502, 504, 506; 257/40, 13, 15, 28

[56] References Cited

U.S. PATENT DOCUMENTS

| | | | |
|---|---|---|---|
| 3,775,631 | 11/1973 | Morikawa | 313/502 |
| 5,076,963 | 12/1991 | Kameyama et al. | 252/301.36 |
| 5,105,233 | 4/1992 | Egusa | 357/17 |
| 5,200,668 | 4/1993 | Ohashi et al. | 313/498 |

FOREIGN PATENT DOCUMENTS

| | | |
|---|---|---|
| 59-194393 | 11/1984 | Japan . |
| 63-295695 | 12/1988 | Japan . |
| 2-209988 | 8/1990 | Japan . |
| 2-250952 | 10/1990 | Japan . |
| 6-111938 | 4/1994 | Japan . |

OTHER PUBLICATIONS

Chihaya Adachi et al. "Confinement of charge carriers and molecular excitons within 5-nm-thick emitter layer in organic electroluminescent deivces with a double heterostructure." American Institute of Physics, Appl. Phys. Lett. 57 (6), Aug. 6, 1990, pp. 531–533.

Noriyuki Takada et al. "Control of emission characteristics in organic thin-film electroluminescent diodes using an optical-microcavity structure." American Institute of Physics, Appl. Phys. Lett. 63 (15), Oct. 11, 1993, pp. 75–77.

Junji Kido et al. "Molecularly Doped Polymers as a Hole Transport Layer in Organic Electroluminescent Devices." Jpn. J. Appl. Phys. vol. 31 (1992), pp. L960–L962.

Primary Examiner—Marie Yamnitzky
Attorney, Agent, or Firm—Oblon, Spivak, McClelland, Maier & Neustadt, P.C.

[57] ABSTRACT

In order to fabricate an organic electroluminescent device with good thermal stability and such high durability that its light emission efficiency is retained over a predetermined level for a long time, an anode is formed on a substrate, one or more organic-inorganic compound layers are formed on the anode, and a cathode is formed on the organic compound layers, sequentially. At least one of the organic compound layers comprises a mixed thin film composed of an organic compound dispersed uniformly in an inorganic compound, or a superlattice structure made of an organic compound and an inorganic compound for preventing the thermal degradation of a fluorescent organic compound constituting an emission layer.

22 Claims, 5 Drawing Sheets

24: INORGANIC COMPOUND
22: ORGANIC COMPOUND

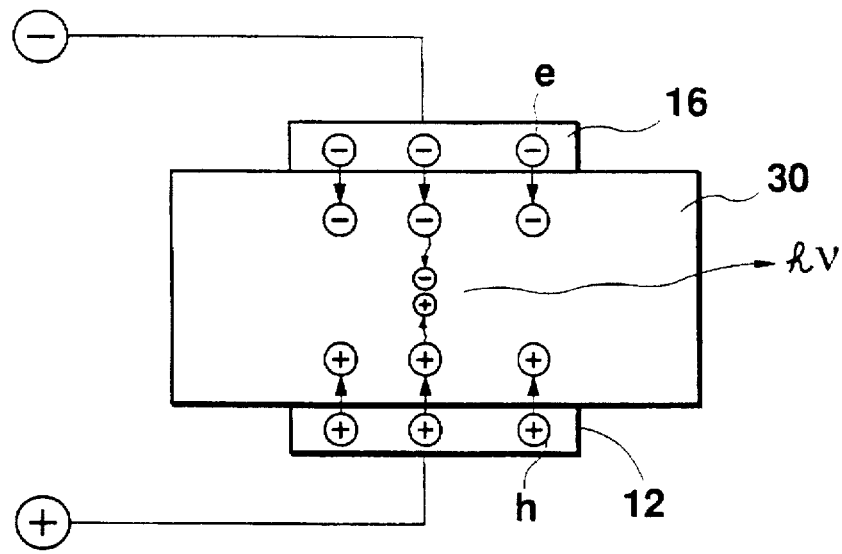
Fig. 10
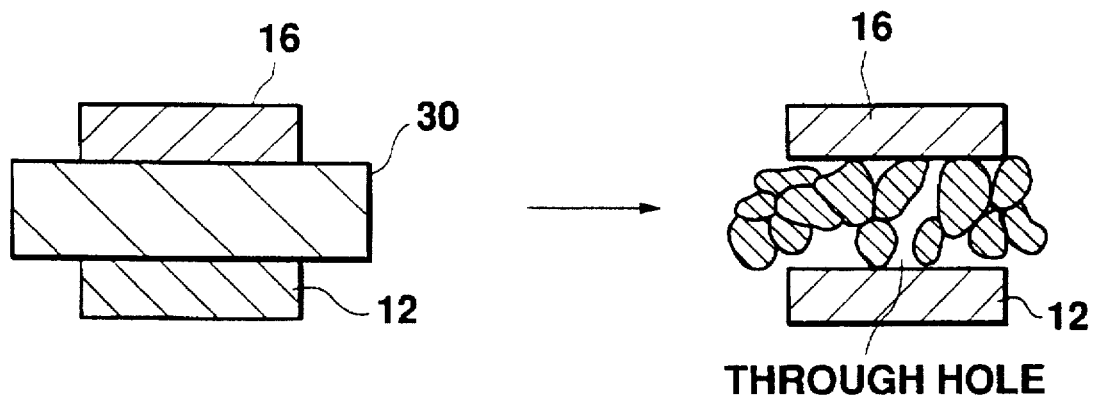
Fig. 11a
PRIOR ART
Fig. 11b
PRIOR ART 5,783,292

1

ELECTROLUMINESCENT DEVICE WITH ORGANIC-INORGANIC COMPOSITE THIN FILM

BACKGROUND OF THE INVENTION

1. Field of the Invention

The present invention relates to an electroluminescent device, particularly to an improved electroluminescent device which is used in a flat luminescent display, and in which a fluorescent organic compound is utilized as luminescent material.

2. Description of the Related Art

Recent progress in the communication industry has had the requirement of a thin-type display having lower energy dissipation compared to a current CRT. A liquid crystal display and plasma display are examples which are already in practical use. In order to reduce the energy dissipation in the displays and to obtain definite natural color images on them, organic electroluminescent devices (electroluminescent devices using fluorescent organic compounds) have been developed. In these devices, a thin film of an organic compound which emits intense fluorescence in a solid state is sandwiched by electrodes. Holes and electrons are injected to the fluorescent organic compound layer from the anode and cathode, respectively. The organic compound is excited when the holes are recombined with the electrons in the organic compound. The organic compound emits fluorescence at a characteristic wavelength when there is a transition of the compound from the excited state to the ground state.

The holes and electrons move in the organic compound layer. A portion of the layer in which the holes move is called "a hole transport layer", a portion in which the electrons move "an electron transport layer" and a portion in which the recombination of the holes and electrons occurs "an emission layer", respectively.

Two structures of organic electroluminescent devices have been reported: one is composed of a single organic compound layer which has all three functions described above, and the other is composed of two or three layers each of which has one or two of the three functions.

A two-layered structure, which is composed of a hole transport layer and an emission layer formed between an anode and cathode, has been disclosed in Japanese Patent Laid-Open Publication No. Sho 59-194393. Another two-layered structure, which is composed of an electron transport layer and an emission layer formed between an anode and cathode, has been disclosed in Japanese Patent Laid-Open Publication No. Hei 2-250952. A three-layered structure, which is composed of a hole transport layer, an electron transport layer and an emission layer which are formed between an anode and cathode, has been disclosed in Appl. Phys. Lett. 57, 531 (1990).

The emission mechanism in an organic electroluminescence device is shown in FIG. 10. Holes h are injected from an anode 12, and electrons e from a cathode 16. The injected holes h and electrons e move in an organic compound layer 30 to recombine with each other. Energy released by the recombination excites surrounding molecules of the organic compound. When there is a transition of the molecule from the excited state to the ground state, the molecule emits a photon hv.

A cross-sectional view of the structure of the organic electroluminescent device described above is shown in FIG. 6. An anode 12 is formed on a substrate 10, an emission layer

2

14 is formed on the anode 12, and a cathode 16 is formed on the emission layer 14. The emission layer 14 also has the functions of hole and electron transport layers. Because the emission layer has the three functions of hole transport, electron transport and emission, it is not easy to achieve improved efficiency of the organic electroluminescent device. In order to improve the efficiency of the organic electroluminescent device, two or three-layered structures have been developed in the field of organic electroluminescent devices.

Cross-sectional views of different two-layered structures for organic electroluminescent devices are shown in FIGS. 7 and 8, respectively. In FIG. 7, a hole transport layer 18 is formed between an anode 12 and an emission layer 14. The holes h injected from the anode 12 move to the emission layer 14 through the hole transport layer 18. The electrons e injected from the cathode 16 move in the emission layer 14. The injected electrons e recombine with the holes h moving from the hole transport layer 18 into the emission layer 14 to emit light.

In FIG. 8, an electron transport layer 20 is formed between a cathode 16 and an emission layer 14. The electrons e injected from the cathode 16 move to the emission layer 14 through the electron transport layer 20. The holes h injected from the anode 12 move in the emission layer 14. The injected holes h recombine with the electrons e moving from the electron transport layer 20 into the emission layer 14 to emit light.

A cross-sectional view of a three-layered structure of the organic electroluminescent device is shown in FIG. 9. A hole transport layer 18 is formed between an anode 12 and an emission layer 14, and an electron transport layer 20 is formed between a cathode 16 and an emission layer 14. The holes h injected from the anode 12 move through the hole transport layer 18 to reach the emission layer 14. The electrons e injected from the cathode 16 move through the electron transport layer 20 to reach the emission layer 14. The holes h and electrons e in the emission layer 14 recombine with each other to emit light.

In the organic electroluminescent device with the structure composed of two or three layers, the two different functions of hole or electron transport and light emission are assigned to the respective layers. This multi-layer structure enables higher efficiency in light emission compared to that of a single layer structure. An organic electroluminescent device which has a multi-layer structure has been developed, emitting light at a luminance of several thousands $cd/m^2$ at an applied D.C. voltage of 10 V.

Aromatic tertiary amines have been used in the hole transport layer 18 as a hole transporting material. Aluminum tris-oxine disclosed in Japanese Patent Laid-Open Publication No. Sho 59-194393 or Japanese Patent Laid-Open Publication No. Sho 63-295695, and styryl amine derivatives and styryl benzene derivatives disclosed in Japanese Patent Laid-Open Publication No. Hei 2-209988, are known as a material for an emission layer 14. Oxadiazole derivatives disclosed in Appl. Phys. Lett. 63, 2032 (1993) are known as a electron transport material. It is considered that an organic electroluminescent device using these materials has practically sufficient efficiencies in color and luminance.

However, the organic electroluminescent device described above has relatively low durability, and consequently a short life. Degradation in luminance (it originally has a high luminance of several thousands $cd/m^2$) occurs and a higher driving voltage is required for operating the device after continuous operation or being stored for a long time.

Structural instability of the fluorescent organic compound film due to the crystallization of the organic compound is one of the main factors affecting the durability of the organic electroluminescent device.

As shown in FIGS. 11a and 11b, the organic compound layer 30, which has originally been fabricated in a uniform thickness and a dense state, is changed into a non-uniform state by the melting or crystallization of the fluorescent organic compound as a result of increased temperature during the operation of the device, and occasionally holes are formed through the organic compound layer 30.

Although aromatic tertiary amines such as triphenyl diamine derivatives (Formula 1 shown below) widely used as the hole transport material, are efficient as a hole transport, they have low thermal stability. The derivatives in a film aggregate at only 60° C., and consequently the structure of the film becomes non-uniform.

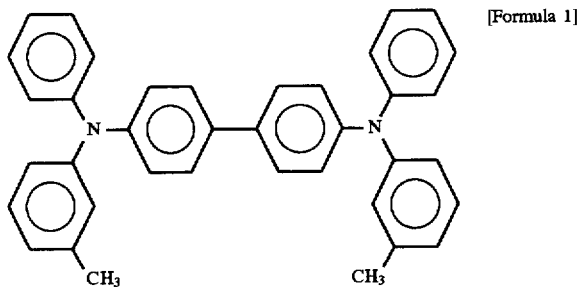

[Formula 1]

The deformation of the organic compound layer 30 as described above causes contact failure or short circuit between the organic compound layer 30 and the anode 12 or cathode 16 in the organic electroluminescent device.

For the stabilization of the structure of the organic compound layer 30, which is essential to solve this problem, fluorescent organic compounds with high thermal stability, namely high melting points, have been synthesized. An organic electroluminescent device using a film made of a fluorescent organic compound added to a thermally resistant polymer has been reported (Jpn. J. Appl. Phys. 31, L960 (1992)).

However, such improvements that only concern the organic compounds cannot realize sufficient thermal stability of the organic electroluminescent device, resulting in a limited improvement of the efficiency of the device.

SUMMARY OF THE INVENTION

The purpose of the present invention is to provide an organic electroluminescent device with high durability, namely the retention of thermal stability and emission efficiency at a predetermined level for a long time.

In accordance with the first aspect of the present invention, an electroluminescent device with an organic-inorganic composite thin film includes one or more organic-inorganic compound layers, a pair of electrodes consisting of an anode disposed on the organic-inorganic compound layers for injecting holes to the organic-inorganic compound layers, and a cathode disposed on the organic-inorganic compound layers oppositely to the anodic electrode for injecting electrons to the organic-inorganic compound layers, at least one of the organic-inorganic compound layers comprising both of an organic compound and an inorganic compound, and at least one of said organic-inorganic compound layers being an emission layer to emit light by recombination of the holes and the electrodes.

In accordance with the second aspect of the present invention, the electroluminescent device with an organic-inorganic composite thin film of the first aspect further comprises a substrate on which the anode or the cathode is formed.

In accordance with the third aspect of the present invention, the electroluminescent device with an organic-inorganic composite thin film of the first aspect wherein at least one of the organic-inorganic compound layers comprises a mixed thin film composed of an organic compound dispersed in an inorganic compound.

In accordance with the fourth aspect of the present invention, the electroluminescent device with an organic-inorganic composite thin film of the third aspect wherein the distance between particles of the organic compound dispersed in the inorganic compound is not larger than 50 Å.

In accordance with the fifth aspect of the present invention, the electroluminescent device with an organic-inorganic composite thin film of the third aspect wherein the concentration of the organic compound is in the range of 10 to 50 vol % with respect to a total volume of the mixed thin film.

In accordance with the sixth aspect of the present invention, the electroluminescent device with an organic-inorganic composite thin film of the third aspect wherein the bandgap of the inorganic compound is wider than that of the organic compound.

In accordance with the seventh aspect of the present invention, the electroluminescent device with an organic-inorganic composite thin film of the sixth aspect wherein the inorganic compound is made of a material selected from the group consisting of metal fluorides such as magnesium fluoride and calcium fluoride, metal oxides such as tin oxide, zinc oxide, silicon oxide and germanium oxide, and wide-bandgap semiconductors such as zinc sulfide, selenium sulfide and gallium phosphide.

In accordance with the eighth aspect of the present invention, the electroluminescent device with an organic-inorganic composite thin film of the third aspect wherein the anode is made of a material selected from the group consisting of metals such as gold, platinum and nickel and alloys thereof and metal oxides such as indium/tin oxide (ITO) and tin oxide ($SnO_2$).

In accordance with the ninth aspect of the present invention, the electroluminescent device with an organic-inorganic composite thin film of the third aspect wherein the cathode is made of a material selected from the group consisting of metals such as silver, tin, magnesium and aluminum, and alloys thereof.

In accordance with the tenth aspect of the present invention, the electroluminescent device with an organic-inorganic composite thin film of the third aspect wherein the emission layer is made of at least one material selected from the group consisting of metal chelating oxinoid compounds, oxadiazole derivatives, butadiene derivatives, perylene derivatives, styryl benzene derivatives and perinon derivatives.

In accordance with the eleventh aspect of the present invention, the electroluminescent device with an organic-inorganic composite thin film of the third aspect wherein the organic-inorganic compound layers includes a hole transport layer to transport holes injected by the anode, the hole transport layer being the mixed thin film.

In accordance with the twelfth aspect of the present invention, the electroluminescent device with an organic-inorganic composite thin film of the eleventh aspect wherein the hole transport layer is made of a material selected from the group consisting of aromatic tertiary amines, phthalocyanine derivatives and pyrazoline derivatives.

In accordance with the thirteenth aspect of the present invention, the electroluminescent device with an organic-inorganic composite thin film of the third aspect wherein the organic-inorganic compound layers include an electron transport layer to transport electrons injected by the cathode, the electron transport layer being the mixed thin film.

In accordance with the fourteenth aspect of the present invention, the electroluminescent device with an organic-inorganic composite thin film of the thirteenth aspect wherein the electron transport layer is made of a material selected from the group consisting of oxadiazole compounds, butadiene derivatives, perylene derivatives and metal chelating oxinoid compounds.

In accordance with the fifteenth aspect of the present invention, the electroluminescent device with an organic-inorganic composite thin film of the third aspect wherein the organic-inorganic compound layers include a hole transport layer to transport holes injected by the anode and an electron transport layer to transport electrons injected by the cathode, the hole transport layer and the electron transport layer being the mixed thin films.

In accordance with the sixteenth aspect of the present invention, the electroluminescent device with an organic-inorganic composite thin film of the third aspect wherein the organic-inorganic compound layers include a hole transport layer to transport holes injected by the anode, an electron transport layer to transport electrons injected by the cathode, and an emission layer to emit light by the recombination of the holes and electrons, the hole transport layer, the electron transport layer and the emission layer being the mixed thin films.

In accordance with the seventeenth aspect of the present invention, the electroluminescent device with an organic-inorganic composite thin film of the third aspect wherein the organic-inorganic compound layers include a hole transport layer to transport the holes injected by the anode, an electron transport layer to transport electrons injected by the cathode, and an emission layer to emit light by the recombination of the holes and electrons, the hole transport layer being formed in a thickness range of 100 to 1000 Å, the emission layer being formed in a thickness range of 100 to 1000 Å.

In accordance with the eighteenth aspect of the present invention, the electroluminescent device with an organic-inorganic composite thin film of the seventeenth aspect wherein the hole transport layer is formed of 500 Å thick mixed-thin film of a triphenyl diamine derivative dispersed in magnesium fluoride at a concentration of 21%, the emission layer is formed of a 500 Å thick aluminum-quinolinol complex film, the anode is formed of a 1500 Å thick indium/tin oxide film, and the cathode is formed of a 2000 Å thick magnesium film.

In accordance with the nineteenth aspect of the present invention, the electroluminescent device with an organic-inorganic composite thin film of the first aspect wherein said at least one of the organic-inorganic compound layers comprises a superlattice structure in which organic compound films and inorganic compound films are alternately disposed.

In accordance with the twentieth aspect of the present invention, the electroluminescent device with an organic-inorganic composite thin film of the nineteenth aspect wherein the thickness of the inorganic compound film constituting the superlattice structure is not larger than 50 Å.

In accordance with the twenty-first aspect of the present invention, the electroluminescent device with an organic-inorganic composite thin film of the nineteenth aspect wherein the organic-inorganic compound layer includes a hole transport layer to transport holes injected by the anode, and an emission layer to emit light by the recombination of the holes and electrons, the hole transport layer being formed of a 560 Å thick super-lattice-structured film wherein seven 30 Å thick magnesium fluoride films and seven 50 Å thick triphenyl diamine derivative films are alternately disposed the emission layer being formed of a 500 Å thick aluminum-quinolinol complex film, the anode being formed of a 1500 Å thick indium/tin oxide film, and the cathode being formed of a 2000 Å thick magnesium film.

In accordance with the twenty-second aspect of the present invention, the electroluminescent device with an organic-inorganic composite thin film of the nineteenth aspect wherein the organic-inorganic compound layer includes a hole transport layer to transport holes injected by the anode and an electron transport layer to transport electrons injected by the cathode, the electron transport layer being the mixed thin film.

In accordance with the twenty-third aspect of the present invention, the electroluminescent device with an organic-inorganic composite thin film of the twenty-second aspect wherein the emission layer is the mixed thin film.

When thin films with a thickness of not larger than 100 Å are stacked up properly to form a superlattice structure, every film of the superlattice structure serves as if it were a crystal plane. When the thin films in which holes h move without difficulty and those in which the holes h move with difficulty are alternately stacked up to form a superlattice structure, the holes h move through the latter films by a hopping mechanism, as in the organic compound-dispersed mixed film. In the present invention, thermally stable inorganic compound layers and semi-conductive organic compound layers are stacked up to form a superlattice structure. Therefore, an electroluminescent device with an organic-inorganic composite thin film having the superlattice structure fabricated according to the present invention is thermally stable.

The above described structure, i.e. an organic-inorganic mixed layer or superlattice structure with an organic compound and an inorganic compound protects the fluorescent organic compound in the organic electroluminescent device by using an inorganic compound which has a remarkably higher melting point than that of organic compounds, thus preventing the thermal degradation of the fluorescent organic compound. The structure provided by the present invention brings about remarkably improved durability of the organic electroluminescent device.

BRIEF DESCRIPTION OF THE DRAWINGS

FIG. 10 shows the light emission mechanism of an organic electroluminescent device.

FIG. 11a shows the thermal degradation of a conventional organic electroluminescent device.

FIG. 11b shows a cross-sectional view of the thermal degradation of a conventional organic electroluminescent device of FIG. 11a.

DESCRIPTION OF THE PREFERRED EMBODIMENTS

Embodiment 1

Figure 1:
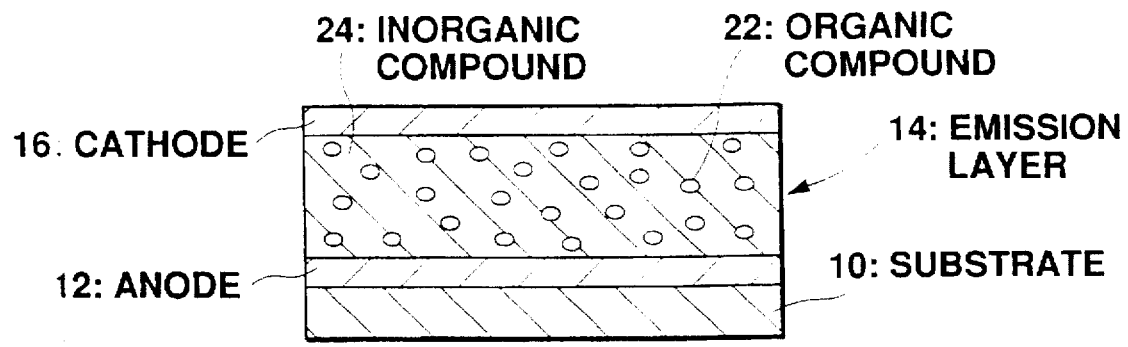
FIG. 1 shows a cross-sectional view of a first embodiment of an electroluminescent device with an organic-inorganic composite thin film composed of a single layer.

FIG. 1 shows a cross-sectional view of an electroluminescent device with an organic-inorganic composite thin film composed of a single layer in Embodiment 1. The organic compound layer shown in FIG. 1 constitutes an emission layer 14. The emission layer 14 formed between an anode 12 and cathode 16 is constituted by a composite thin film in which an organic compound 22 is enclosed with an inorganic compound 24. In FIG. 1, the organic compound 22 is uniformly dispersed in the inorganic compound 24. Therefore, the composite film shown in FIG. 1 is a mixed thin film consisting of the organic compound 22 dispersed in the inorganic compound 24.

The inorganic compound used in the mixed thin film has a much higher melting point compared to that of the organic compound, and high thermal and chemical stability. The dispersion of the organic compound in the inorganic compound enables the protection of the organic compound and the increase in thermal stability of the mixed thin film, leading to improved durability of the organic electroluminescent device.

The above described mixed thin film is formed by evaporating at an evaporation chamber pressure below approximately $10^{-5}$ Torr. The organic compound 22 and the inorganic compound 24 are simultaneously deposited on a substrate 10 from respective sources. The concentration of the organic compound 22 in the mixed thin film is controlled by adjusting the ratio of the deposition rates for the organic compound 22 and inorganic compound 24.

It is preferable that the organic compound 22 is uniformly dispersed in the mixed thin film. The mutual distance between organic compound 22 particles dispersed in the mixture thin film is required to be less than 50 Å, because hopping conductivity by the holes or electrons in the thin film should occur. The organic compound 22 can be dispersed in a form of isolated molecules or molecule clusters. The preferred concentration of the organic compound in the mixed thin film is less than 50 vol % to obtain high thermal stability, and more than 10% to obtain stable conductivity.

Figure 2:
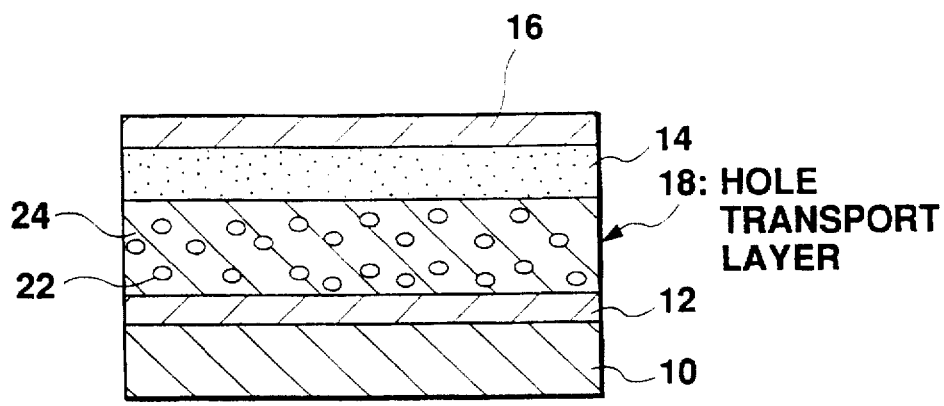
FIG. 2 shows a cross-sectional view of a first embodiment of an electroluminescent device with an organic-inorganic composite thin film composed of two layers including a hole transport layer in Embodiment 1.
Figure 3:
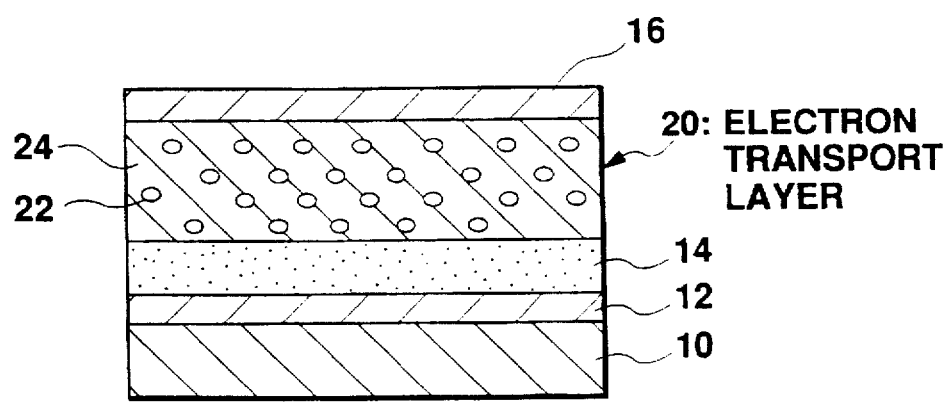
FIG. 3 shows a cross-sectional view of a first embodiment of an electroluminescent device with an organic-inorganic composite thin film composed of two layers including an electron transport layer in Embodiment 1.
Figure 4:
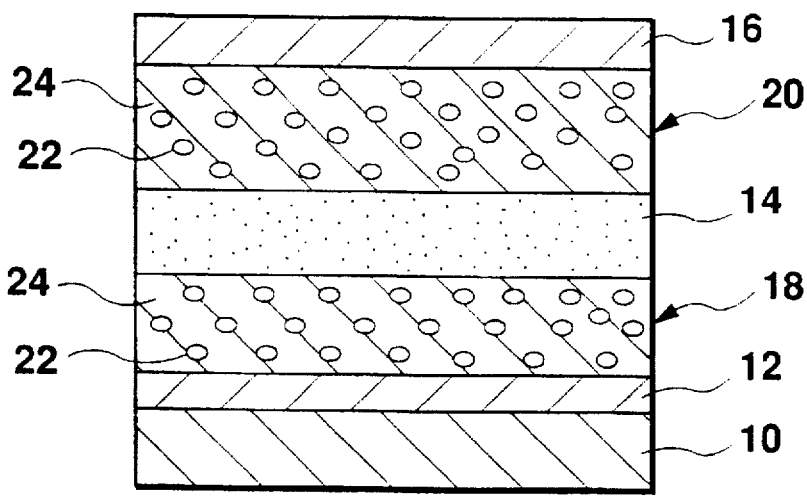
FIG. 4 shows a cross-sectional view of a first embodiment of an electroluminescent device with an organic-inorganic composite thin film composed of three layers in Embodiment 1.

Other uses of the mixed thin film in Embodiment 1, other than the emission layer 14, are shown in FIGS. 2 to 4.

An electroluminescent device with an organic-inorganic composite thin film composed of two layers, in one of which the mixed thin film is used as a hole transport layer 18, is shown in FIG. 2. The holes h injected from an anode 12 move in the hole transport layer 18 by a hopping mechanism to reach the emission layer 14. The electrons e injected from a cathode 16 move into the emission layer 14. The electrons e recombine with the holes h in the emission layer 14, thereby emitting light from the emission layer 14.

An electroluminescent device with an organic-inorganic composite thin film composed of two layers, in one of which the mixed thin film is used as an electron transport layer 20, is shown in FIG. 3. The electrons e injected from a cathode 16 move in the electron transport layer 20 by hopping to reach the emission layer 14. The holes h injected from an anode 12 move into the emission layer 14. The holes h recombine with the electrons e in the emission layer 14, thereby emitting light from the emission layer 14.

An electroluminescent device with an organic-inorganic composite thin film composed of three layers, in one of which the mixed thin film is used as a hole transport layer 18, and in another as an electron transport layer 20, is shown in FIG. 4. The holes h and electrons e move in a hole transport layer 18 and an electron transport layer 20, respectively by hopping to reach the emission layer 14. The holes h and electrons e recombine with each other in the emission layer 14, thereby emitting light from the emission layer 14.

In another electroluminescent device with an organic-inorganic composite thin film composed of two layers, the mixed thin film is used as an emission layer 14, or as an emission layer 14 and a hole transport layer 18 or an electron transport layer 20. In another electroluminescent device with an organic-inorganic composite thin film composed of three layers, the mixed thin film is used as at least one of an emission layer 14, a hole transport layer 18 and an electron transport layer 20. The durability of an organic electroluminescent device can be improved by using the mixed thin film in the parts requiring thermal stability.

The feature of this embodiment is that at least one among an emission layer 14, a hole transport layer 18 and an electron transport layer 20 which constitute an organic compound layer of an organic electroluminescent device is formed with the mixed thin film.

All organic materials currently used in the organic compound 22 layer of the organic electroluminescent device are usable for the present invention. As to organic materials for the hole transport layer 18, aromatic tertiary amines, phthalocyanine derivatives or pyrazoline derivatives are used, and especially, the aromatic tertiary amines are the most effective among them.

As to organic materials for the emission layer 14, metal chelating oxinoid compounds, oxadiazole derivatives, butadiene derivatives, perylene derivatives, styryl benzene derivatives and perinon derivatives are used.

As to organic materials for the electron transport layer 20, oxadiazole compounds, butadiene derivatives and perylene derivatives as well as metal chelating oxinoid compounds are used.

Any inorganic materials are usable for dispersing the organic compounds 22 as long as the inorganic materials do not degrade the property of the organic compounds 22 and form a dense and uniform film. The preferable is an inorganic compound produced in a predetermined chemical composition in film form by a general vacuum deposition method at a source temperature below 1500° C. and having a wider band gap than that of the organic compounds 22. For example, metal fluorides such as magnesium fluoride, calcium fluoride or metal oxides such as tin oxide, zinc oxide, silicon oxide, germanium oxide are used. Additionally semiconductors with wide band gaps such as zinc sulfide, selenium sulfide, gallium arsenide can be utilized.

As to materials for the anode 12, metals such as gold, platinum, nickel and alloys thereof, or metal oxides with large work functions such as indium-tin oxide (ITO), tin oxide ($SnO_2$) are used.

As to materials for the cathode 16, metals with small work functions such as silver, tin, magnesium, aluminum, or alloys thereof are used.

At least one of the two electrodes (anode 12 and cathode 16) is preferably transparent in the wavelength range of the light emitted from the organic electroluminescence device.

The electroluminescent device with an organic-inorganic composite thin film provided by the present invention is fabricated by sequential deposition of the above described layers on a glass or silicon substrate. The device can be sealed together with silicone oil in a glass cell in order to protect the device from water in the air and to achieve stable operation.

Examples based on Embodiment 1 are shown together with Comparative Examples as follows:

EXPERIMENT 1
(Properties of the composite thin film)

In order to demonstrate that a composite thin film has higher stability compared with that of a thin film of an organic compound only, a composite thin film composed of an inorganic compound of magnesium fluoride and an organic compound of triphenyl diamine derivative (Formula 2 shown below) are chosen. The composite thin film in this experiment is a mixed thin film composed of the organic compound dispersed in the inorganic compound.

triphenyl diamine derivative

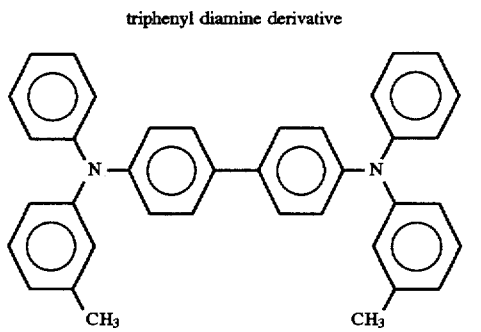

[Formula 2]

Figure 12:
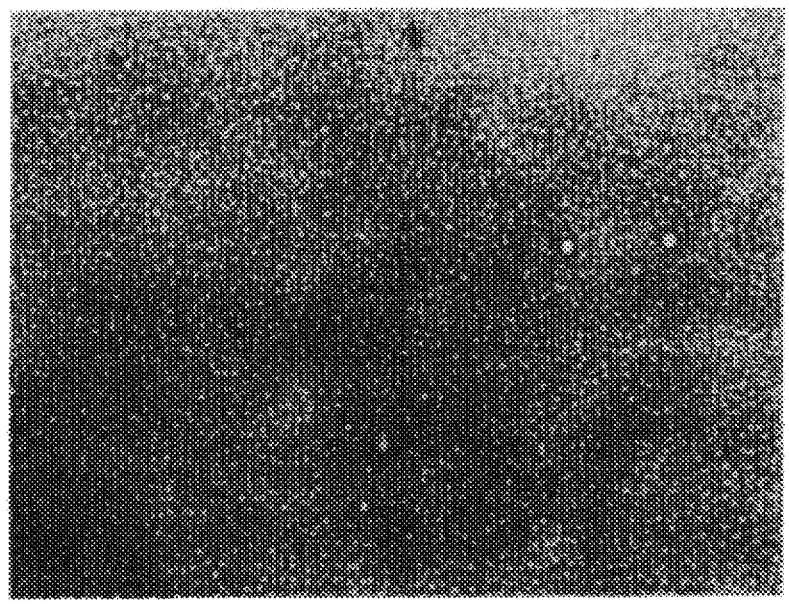
FIG. 12 shows a scanning electron micrograph of a thermally treated composite film prepared in Experiment 1 of the present invention (magnitude: × 1000).

A composite (mixed) thin film of magnesium fluoride and a triphenyl diamine derivative was formed on a silicon substrate by a vacuum deposition method. The pressure in the deposition chamber was $1 \times 10^{-7}$ Torr. The deposition rates were 40 Å/min for magnesium fluoride, and 11 or 6 Å/min for the triphenyl diamine derivative. The total thickness of the composite thin films was approximately 1000 Å. The deposition condition of the composite thin films is shown in Table 1. Both composite films were transparent and uniform. After both composite films were thermally treated at 82° C. for two hours, their surfaces were observed with a scanning electron microscope (FIG. 12). The films were observed to retain their uniform and dense morphology and to have no pinhole even after the thermal treatment. It was confirmed from the observation that the morphology of the composite thin film prepared in this experiment is thermally stable.

TABLE 1

FILM FORMATION CONDITION FOR COMPOSITE THIN FILMS

| COMPOSITE THIN FILM | PRESSURE (Torr) | DEPOSITION RATE (Å/min) | | FILM THICKNESS (Å) |
|---|---|---|---|---|
| | | $MgF_2$ | TPD | |
| SAMPLE 1 | $1 \times 100^{-7}$ | 40 | 11 | 1000 |
| SAMPLE 2 | $1 \times 100^{-7}$ | 40 | 6 | 1000 |

$MgF_2$: MAGNESIUM FLUORIDE
TPD: TRIPHENYL DIAMINE DERIVATIVE

COMPARATIVE EXAMPLE 1

Figure 13:
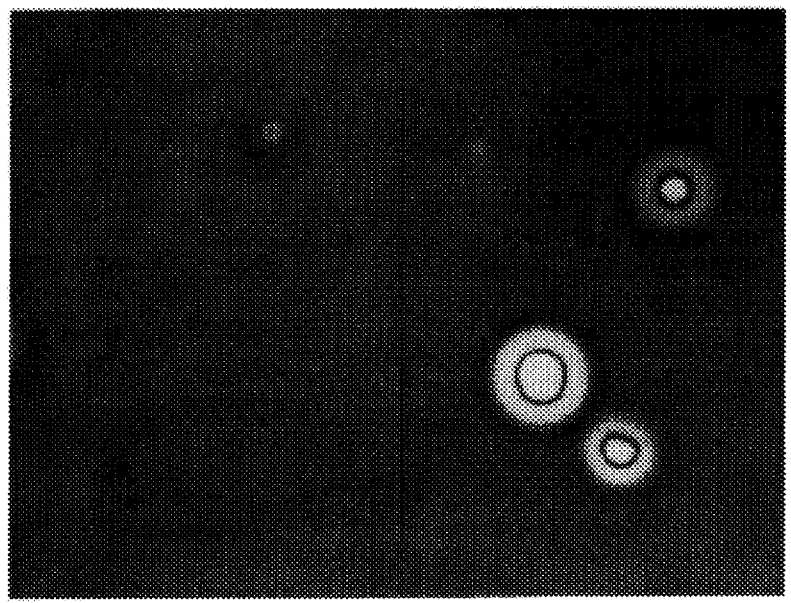
FIG. 13 shows a scanning electron micrograph of a thermally treated triphenyl diamine film prepared in Comparative Example 1 (magnitude: × 1000).

A thin film of a triphenyl diamine derivative was formed on a silicon substrate by a vacuum deposition method. The pressure in the deposition chamber was $1 \times 10^{-7}$ Torr. The total thickness of the thin film was approximately 1000 Å. The thin film of the triphenyl diamine derivative was thermally treated at 82° C. for two hours, as the same manner in Experiment 1. The thermal treatment generated aggregates, and consequently pinholes in the thin film, leading to non-uniformity of the thin film (FIG. 13).

EXPERIMENT 2, 3
(An organic electroluminescent device, in which a composite thin film is used as a hole transport layer.)

An organic electroluminescent device using the above described composite thin film for a hole transport layer was fabricated. The fabricated device had a two-layered structure, as shown in FIG. 2. A glass substrate was thoroughly washed with acetone. As an anode 12, indium-tin oxide (ITO; thickness: approximately 1500 Å, light transmittance: 80%, surface resistivity: 20 Ω/□) was deposited on the washed glass substrate by a radio-frequency sputtering method. A hole transport layer 18 of a composite thin film was formed on the anode 12 at a thickness of approximately 500 Å by the vacuum deposition method as in Experiment 1. An emission layer 14 of aluminum-quinolinol complex (the Formula 3 shown below) was formed on the hole transport layer 18 at a thickness of approximately 500 Å.

aluminum-quinolinol complex

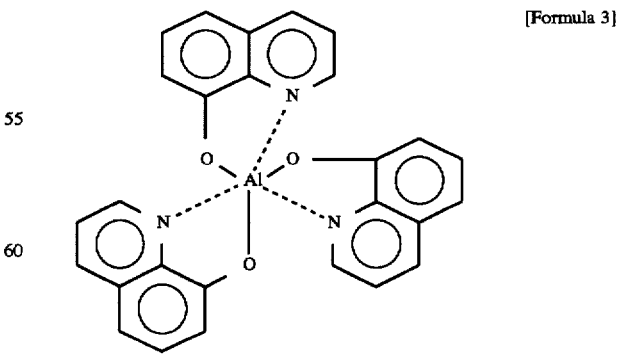

[Formula 3]

The pressure in the deposition chamber was approximately $1 \times 10^{-7}$ Torr. The temperature of the substrate was room temperature. A cathode 16 of magnesium was finally formed on the emission layer 14 at a thickness of approximately 2000 Å under an deposition chamber pressure of $1\times10^{-6}$ Torr. The size of the device was 3 mm in length, 3 mm in width, and fifteen devices were fabricated on a glass substrate (length: 25 mm, width: 35 mm). D.C. voltage was applied to the electrodes of the electroluminescent device with an organic-inorganic composite thin film, positively to the anode 12 and negatively to the cathode 16. Green light emission was clearly observed for a long time when the applied D.C. voltage was over 7 V. This result shows that the composite thin film composed of magnesium fluoride and a triphenyl diamine derivative has the same function as a hole transport layer 18 in a thin film of the triphenyl diamine derivative. The comparison between the efficiencies of the devices in Experiments 2, 3 is shown in Table 2.

TABLE 2

COMPARISON IN LUMINANCE BETWEEN COMPOSITE THIN FILM TYPE DEVICES

| ORGANIC ELECTRO-LUMINESCENCE DEVICE | TPD CONCEN-TRATION (vol %) | MINIMUM DRIVING VOLTAGE | MAXIMUM LUMINANCE (cd/m$^2$) |
|---|---|---|---|
| EXPERIMENT 2 | 21 | 7 | 1800 |
| EXPERIMENT 3 | 11 | 9 | 600 | vol %: VOLUME PERCENT

When the concentration of a triphenyl diamine derivative in the composite thin film shown in Experiment 2 was 21 vol %, the luminance of the device was high luminance of 1800 cd/m$^2$ at an applied voltage of 15 V and a current density of 100 mA/cm$^2$. In this electroluminescent device with a composite thin film, the rapid decrease in luminance at the initial stage, which is frequently observed in conventional organic electroluminescent devices, was not observed. The initial luminance of 100 cd/m$^2$ decreased only to 50 cd/m$^2$ at a driving current density of 20 mA/cm$^2$ even after operation for 20 hours. When the concentration of a triphenyl diamine derivative in the composite thin film shown in Experiment 3 was 11 vol %, the maximum luminance of the device was 600 cd/cm$^2$.

COMPARATIVE EXAMPLE 2

An organic electroluminescent device was fabricated by the same manner as in Experiments 2, 3 above, except using an organic compound for the hole transport layer. The device has an approximately 500 Å triphenyl diamine derivative layer as the hole transport layer. This device emitted light when the applied voltage was over 5 V. Although a maximum luminance of 2000 cd/m$^2$ was observed at an applied voltage of 14 V at the initial stage, the luminance decreased rapidly. At a driving current density of 20 mA/cm$^2$, the initial luminance of 200 cd/M$^2$ decreased to 20 cd/M$^2$ after only two hours.

EXPERIMENT 4

In order to compare the thermal stability of the organic-inorganic composite thin film electroluminescent device provided by the present invention with that of a conventional organic electroluminescent device, fifteen devices (both groups) were thermally treated in an oven at 82° C. for two hours. All the thermally treated conventional devices suffered from shortcircuits, and then were broken. All the organic-inorganic composite thin film electroluminescent devices emitted light at a luminance of 600 cd/m$^2$ (applied voltage: 14 V) even after the thermal treatment (Table 3). It was found from this result that the organic-inorganic composite thin film electroluminescent devices, in which a composite thin film was used for a hole transport layer, had much higher thermal stability and durability compared to those of the conventional organic electroluminescent devices.

TABLE 3

CHARACTERISTICS OF ORGANIC ELECTROLUMINESCENCE DEVICES BEFORE AND AFTER THERMAL TREATMENT (82° C., 2 HOURS)

| ORGANIC ELECTROLUMINESCENCE DEVICE | LUMINANCE (cd/m$^2$) | |
|---|---|---|
| | BEFORE | AFTER |
| CURRENT TYPE | 2000 | SHORT CIRCUIT |
| COMPOSITE THIN FILM TYPE | 1800 | 600 |

EXPERIMENT 5

(An organic electroluminescent device in which a composite thin film is used as an emission layer.)

As in Experiments 2 and 3 an approximately 500 Å film of a pure triphenyl diamine derivative was formed on an ITO-coated glass substrate. An approximately 500 Å composite film of magnesium fluoride and perylene (Formula 4 shown below) was formed on the triphenyl diamine film.

perylene

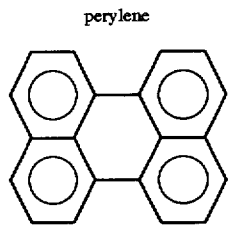

[Formula 4]

Magnesium fluoride and perylene were simultaneously deposited at the rate of 20 Å/min and approximately 20 Å/min, respectively. A 2000 Å magnesium film was finally formed as a cathode 16. The fabricated devices emitted yellow light when a driving D.C. voltage over approximately 8 V was applied to the devices. A spectrum of the yellow light approximately corresponded to that of the fluorescence of perylene. This result indicates that the composite thin film of magnesium fluoride and perylene functions as an emission layer 14 like the perylene film in the conventional devices. The composite thin film emitted light at a luminance of approximately 100 cd/m$^2$ at an applied voltage of 15 V and current density of 100 mA/cm$^2$.

EXPERIMENT 6

(An organic electroluminescent device of a single layer in which a composite thin film is used)

An organic electroluminescent device with a single layer which has two functions of a hole transport and light emission is demonstrated hereinafter.

An organic electroluminescent device with a single layer shown in FIG. 1 was fabricated as follows:

An composite thin film composed of magnesium fluoride, a triphenyl diamine derivative and aluminum-quinolinol complex was formed on an ITO-coated glass substrate by simultaneous deposition at the deposition rates of 40 Å/min, 20 Å/min and 22 Å/min respectively. An approximately 2000 Å magnesium film was finally formed as a cathode 16. When a driving D.C. voltage of an approximately 20 V was applied to this single-layered organic electroluminescent device, emission of green light at a luminance of approximately 10 cd/M² was observed. It was confirmed from this result that a composite thin film composed of more than two kinds of organic and inorganic compounds functions as an electroluminescent device.

Embodiment 2

Figure 5:
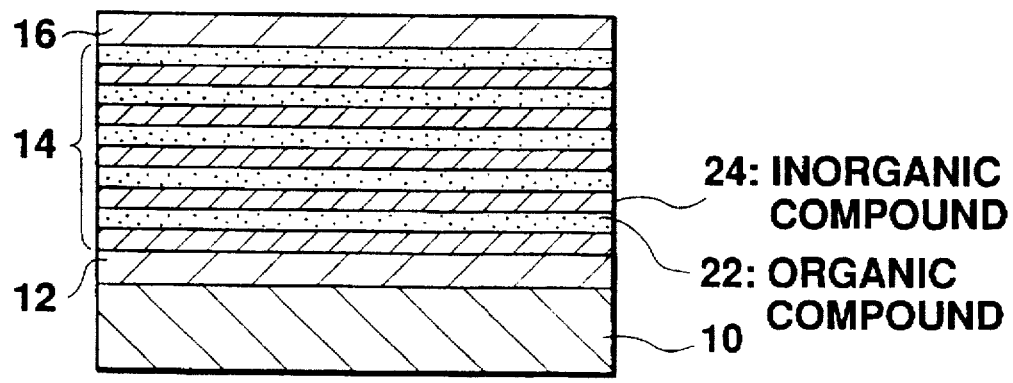
FIG. 5 shows a cross-sectional view of a second embodiment of an electroluminescent device with an organic-inorganic composite thin film composed of a single layer in Embodiment 2.
Figure 6:
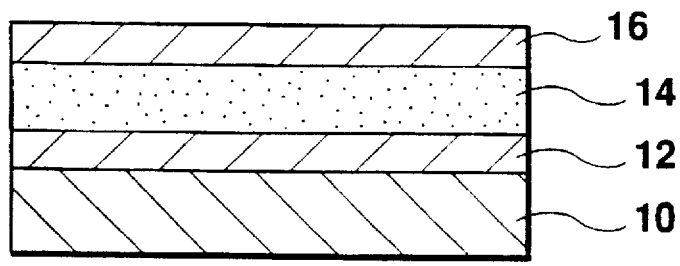
FIG. 6 shows a cross-sectional view of a conventional organic electroluminescent device composed of a single fluorescent organic compound layer.
Figure 7:
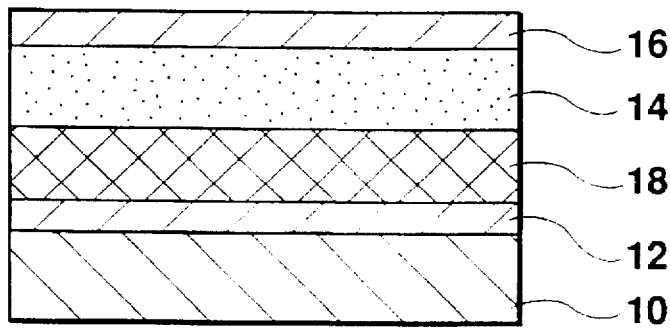
FIG. 7 shows a cross-sectional view of a conventional organic electroluminescent device composed of two layers including a hole transport layer.
Figure 8:
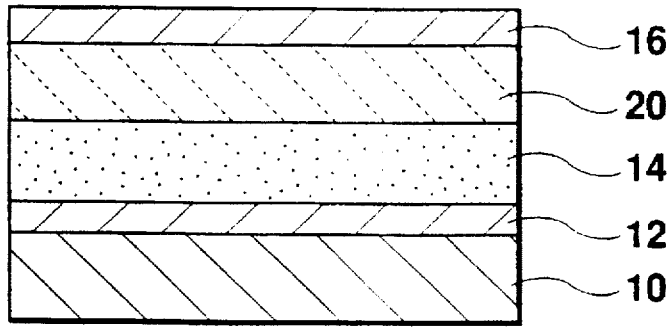
FIG. 8 shows a cross-sectional view of a conventional organic electroluminescent device composed of two layers including an electron transport layer.
Figure 9:
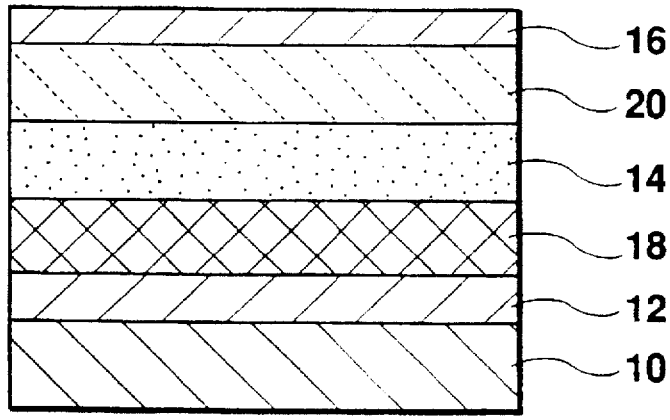
FIG. 9 shows a cross-sectional view of a conventional organic electroluminescent device composed of three layers.

FIG. 5 shows an organic electroluminescent device with an organic-inorganic composite thin film according to Embodiment 2 of the present invention.

FIG. 5 represents an organic electroluminescent device composed of a single layer, as in FIG. 1. An emission layer 14 is composed of a superlattice composite thin film comprising an organic compound 22 and an inorganic compound 24 which are alternately laminated.

In this embodiment, an organic compound is sandwiched with an inorganic compound having a superlattice structure. The sandwiched organic compound is protected from thermal degradation as in Embodiment 1, and consequently the durability of the organic electroluminescent device can be much improved.

This superlattice thin film is formed on a predetermined substrate by depositing the organic compound 22 and the inorganic compound 24 alternately from respective sources at a vacuum chamber pressure below approximately $10^{-5}$ Torr. The respective deposition rates are controlled by adjusting the respective source temperatures independently based on the film thicknesses monitored by a film thickness monitor. The thickness of the inorganic compound 24 layer in the super lattice thin film is required to be less than 50 Å, because hopping conductivity by the holes or electrons in the super lattice thin film should occur.

This superlattice thin film can be used for an electroluminescent device with an organic-inorganic composite thin film composed of two or three layers, as well as of a single layer, as shown in Embodiment 1 (not shown).

The materials for the organic compound 22, inorganic compound 24, anode 12 and cathode 16 in this embodiment can be the same as those in Embodiment 1.

The electroluminescent device with an organic-inorganic composite thin film shown in Embodiment 2 is also fabricated by forming the respective layers sequentially on a glass or semiconductor (such as silicone) substrate. The device can be sealed together with silicone oil in a glass cell in order to protect the device from water in the air and to achieve stable operation.

An experimental example based on Embodiment 2 is shown as follows:

EXPERIMENT 7
(An organic electroluminescent device in which a superlattice thin film is used for a hole transport layer.)

ITO is formed on a glass substrate by the same method as in Experiments 2 and 3. Seven layers of magnesium fluoride (thickness of one layer: 30 Å) and seven layers of a triphenyl diamine derivative (thickness of one layer: 50 Å) were formed alternately on the ITO-coated glass substrate to fabricate a super lattice thin film (the total thickness of the superlattice thin film: 560 Å). A thin film of aluminum-quilinol complex (thickness: 500 Å) was formed on the super lattice thin film and finally a magnesium electrode was formed thereon. When a driving D.C. voltage applied to the device was over approximately 7 V, emission of green light was clearly observed. The device emitted light at a luminance of 150 cd/M² at an applied D.C. voltage of 14 V. This device did not suffer the rapid decrease in luminance at the initial stage, and kept a relatively high efficiency in luminance for several hours.

As described above, the improvement in stability of the thin film structure used for carrier (hole and electron) transport and light emission, and the suppression of device degradation are achieved by the present invention. Therefore, the present invention provides an organic electroluminescent device with good thermal stability and such high durability that its light emission efficiency is retained over a predetermined level for a long time. Organic compounds which do not solely form a uniform thin film can be utilized for the carrier transport or light emission layer by combining them with inorganic compounds, because thus obtained composite material can be a uniform thin film. Therefore, the organic electroluminescent device provided by the present invention has great technological and practical advantage in the field of displays.

While particular embodiments of the invention have been shown and described, various modifications will be apparent to those of ordinary skill in the art, and therefore, it is not intended that the invention be limited to the disclosed embodiments, or to details of them, and departures may be made from them within the spirit and scope of the invention.

We claim:

1. An electroluminescent device with an organic-inorganic composite film comprising:

one or more organic-inorganic compound layers, the organic-inorganic compound layers comprising both of an organic compound and an inorganic compound;

a pair of electrodes consisting of an anode disposed on the organic-inorganic compound layers for injecting holes to the organic-inorganic compound layers and a cathode disposed on the organic-inorganic compound layers oppositely to the anodic electrode for injecting electrons to the organic-inorganic compound layers; and an emission layer to emit light by recombination of the holes and the electrons, the emission layer comprising at least one of the organic-inorganic compound layers or an organic compound layer;

wherein in said one or more organic-inorganic compound layers
   (a) the inorganic compound has a higher melting point than the organic compound; and
   (b) the organic-inorganic compound layers comprise
      (i) a mixed film comprising particles of an organic compound dispersed in an inorganic compound wherein the distance between particles of the organic compound dispersed in the inorganic compound is not larger than 50 Å; and/or
      (ii) a superlattice structure comprising alternating organic compound films and inorganic compound films wherein the inorganic compound films are not thicker than 50 Å.

2. An electroluminescent device with an organic-inorganic composite film in accordance with claim 1, further comprising a substrate on which the anode or the cathode is formed.

3. An electroluminescent device with an organic-inorganic composite film in accordance with claim 1, wherein the concentration of the organic compound is in the range of 10 to 50 vol % with respect to a total volume of the mixed film.

4. An electroluminescent device with an organic-inorganic composite film in accordance with claim 1, wherein in said one or more organic-inorganic compound layers the bandgap of the inorganic compound is wider than that of the organic compound.

5. An electroluminescent device with an organic-inorganic composite film in accordance with claim 4, wherein the inorganic compound is of a material selected from the group consisting of metal fluorides, metal oxides, zinc sulfide, selenium sulfide and gallium phosphide.

6. An electroluminescent device with an organic-inorganic composite film in accordance with claim 4, wherein the inorganic compound is of a material selected from the group consisting of magnesium fluoride, calcium fluoride, tin oxide, zinc oxide, silicon oxide and germanium oxide.

7. An electroluminescent device with an organic-inorganic composite film in accordance with claim 1, wherein the anode is of a material selected from the group consisting of metals and metal oxides.

8. An electroluminescent device with an organic-inorganic composite film in accordance with claim 1, wherein the cathode is of a material selected from the group consisting of metals and alloys thereof.

9. An electroluminescent device with an organic-inorganic composite film in accordance with claim 1 wherein the emission layer is made of at least one material selected from the group consisting of metal chelating oxinoid compounds, oxadiazoles, butadienes, perylenes, styryl benzenes and perinones.

10. An electroluminescent device with an organic-inorganic composite film in accordance with claim 1, wherein the organic-inorganic compound layers include a hole transport layer to transport holes injected by the anode, the hole transport layer being the mixed film.

11. An electroluminescent device with an organic-inorganic composite film in accordance with claim 10, wherein the hole transport layer is made of a material selected from the group consisting of aromatic tertiary amines, phthalocyanines and pyrazolines.

12. An electroluminescent device with an organic-inorganic composite film in accordance with claim 1, wherein the organic-inorganic compound layers include an electron transport layer to transport electrons injected by the cathode, the electron transport layer being the mixed film.

13. An electroluminescent device with an organic-inorganic composite film in accordance with claim 12, wherein the electron transport layer is of a material selected from the group consisting of oxadiazole compounds, butadienes, perylenes and metal chelating oxinoid compounds.

14. An electroluminescent device with an organic-inorganic composite film in accordance with claim 1, wherein the organic-inorganic compound layers include a hole transport layer to transport holes injected by the anode and an electron transport layer to transport electrons injected by the cathode, the hole transport layer and the electron transport layer being the mixed films.

15. An electroluminescent device with an organic-inorganic composite film in accordance with claim 1, wherein the organic-inorganic compound layers include a hole transport layer to transport holes injected by the anode, an electron transport layer to transport electrons injected by the cathode, and the emission layer to emit light by the recombination of the holes and electrons, the hole transport layer, the electron transport layer and the emission layer being the mixed films.

16. An electroluminescent device with an organic-inorganic composite film in accordance with claim 1, wherein the organic-inorganic compound layers include a hole transport layer to transport the holes injected by the anode, an electron transport layer to transport electrons injected by the cathode, and the emission layer to emit light by the recombination of the holes and electrons, the hole transport layer being in a thickness range of 100 to 1000 Å, the emission layer being in a thickness range of 100 to 1000 Å.

17. An electroluminescent device with an organic-inorganic composite film in accordance with claim 16, wherein the hole transport layer is a 500 Å thick mixed film of a triphenyl diamine dispersed in magnesium fluoride at a concentration of 21%, the emission layer is a 500 Å thick aluminumquinolinol complex film, the anode is a 1500 Å thick indium/tin oxide film, and the cathode is a 2000 Å thick magnesium film.

18. An electroluminescent device with an organic-inorganic composite film in accordance with claim 1, wherein the organic-inorganic compound layer includes a hole transport layer to transport holes injected by the anode, the hole transport layer being a 560 Å thick super-lattice-structured film wherein seven 30 Å thick magnesium fluoride films and seven 50 Å thick triphenyl diamine films are alternately disposed, with the emission layer being a 500 Å thick aluminumquinolinol complex film, the anode being a 1500 Å thick indium/tin oxide film, and the cathode being a 2000 Å thick magnesium film.

19. An electroluminescent device with an organic-inorganic composite film in accordance with claim 1, wherein the organic-inorganic compound layers include a hole transport layer to transport holes injected by the anode and an electron transport layer to transport electrons injected by the cathode, the electron transport layer being the super-lattice-structured film.

20. An electroluminescent device with an organic-inorganic composite film in accordance with claim 19, wherein the emission layer is also a superlattice-structured film.

21. An electroluminescent device with an organic-inorganic composite film in accordance with claim 1, wherein the anode is of a material selected from the group consisting of gold, platinum, nickel, alloys thereof, indium/tin oxide and tin oxide.

22. An electroluminescent device with an organic-inorganic composite film in accordance with claim 1, wherein the cathode is of a material selected from the group consisting of silver, tin, magnesium, aluminum and alloys thereof.

* * * * *